(12) United States Patent
Yamaura et al.

(10) Patent No.: US 6,831,360 B2
(45) Date of Patent: Dec. 14, 2004

(54) SEMICONDUCTOR DEVICE HAVING AN ELASTIC RESIN WITH A LOW MODULUS OF ELASTICITY

(75) Inventors: Masashi Yamaura, Komoro (JP); Hirokazu Nakajima, Saku (JP); Nobuyoshi Maejima, Komoro (JP); Mikio Negishi, Komoro (JP); Tomio Yamada, Komoro (JP); Tomomichi Koizumi, Komoro (JP); Tsuneo Endoh, Komoro (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/021,173

(22) Filed: Dec. 19, 2001

(65) Prior Publication Data

US 2002/0089052 A1 Jul. 11, 2002

(30) Foreign Application Priority Data

Jan. 10, 2001 (JP) ........................................ 2001-002371

(51) Int. Cl.[7] .............................................. H01L 23/34
(52) U.S. Cl. ......................... 257/724; 257/678; 257/779
(58) Field of Search ................................. 257/668, 678, 257/690, 701, 702, 703, 723–725, 778–783

(56) References Cited

U.S. PATENT DOCUMENTS 4,785,533 A * 11/1988 Seino et al. ................... 29/827
5,989,993 A * 11/1999 Zakel et al. .................. 438/614
6,195,260 B1 * 2/2001 Moriyama ................... 361/749
6,329,065 B1 * 12/2001 Ishida et al. ................. 428/472

FOREIGN PATENT DOCUMENTS

| JP | 11-238962 | 8/1999 |
| JP | 2000-223623 | 8/2000 |

OTHER PUBLICATIONS

Wolf et al., Silicon Processing For the VLSI Era, Lattice Press, vol. 1, pp. 851–859.*

* cited by examiner

Primary Examiner—Nathan J. Flynn
Assistant Examiner—Leonardo Andújar
(74) Attorney, Agent, or Firm—Mattingly, Stanger & Malur, P.C.

(57) ABSTRACT

A semiconductor device comprising semiconductor chips each formed with plural pads at the main surface, chip parts each formed with connection terminals at both ends thereof, a module substrate on which the semiconductor chips and the chip parts are mounted, solder connection portions for connecting the chip parts and the substrate terminals of the module substrate by soldering, gold wires for connecting the pads of the semiconductor chips and corresponding substrate terminals of the module substrate, and a sealing portion formed with a low elasticity resin such as an insulative silicone resin or a low elasticity epoxy resin for covering the semiconductor chips, chip parts, solder connection portions and gold wires which prevents flow out of the solder in the solder connection portion by re-melting thereby preventing short-circuit.

16 Claims, 15 Drawing Sheets

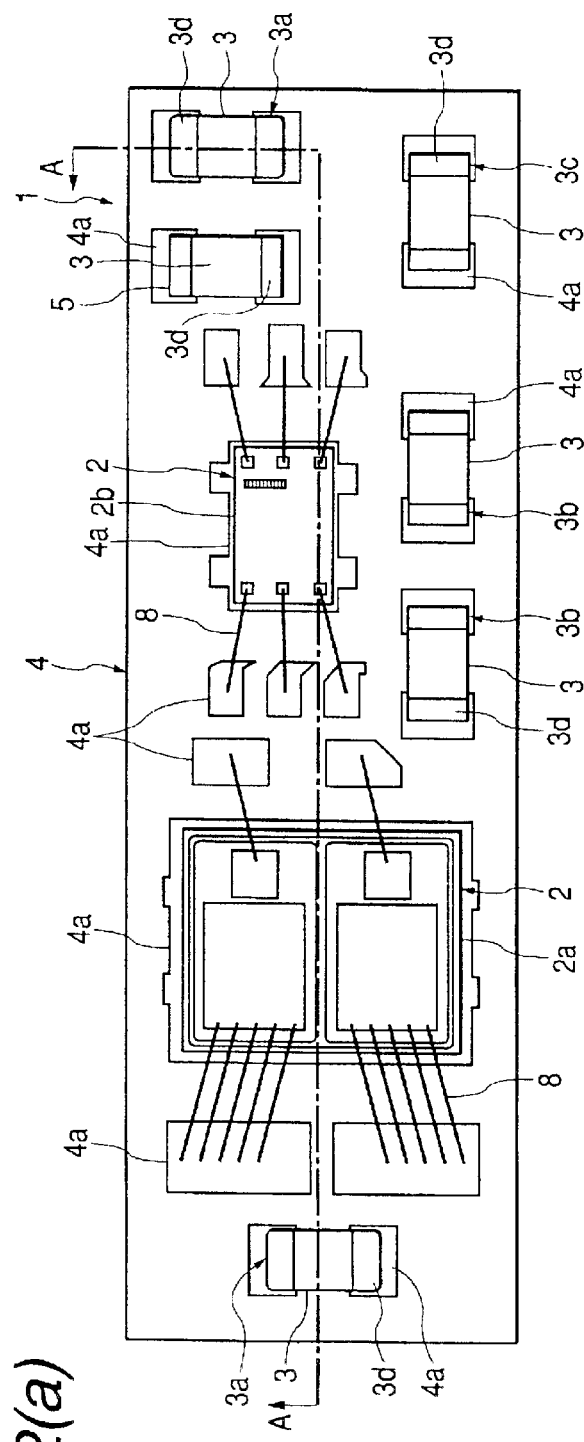
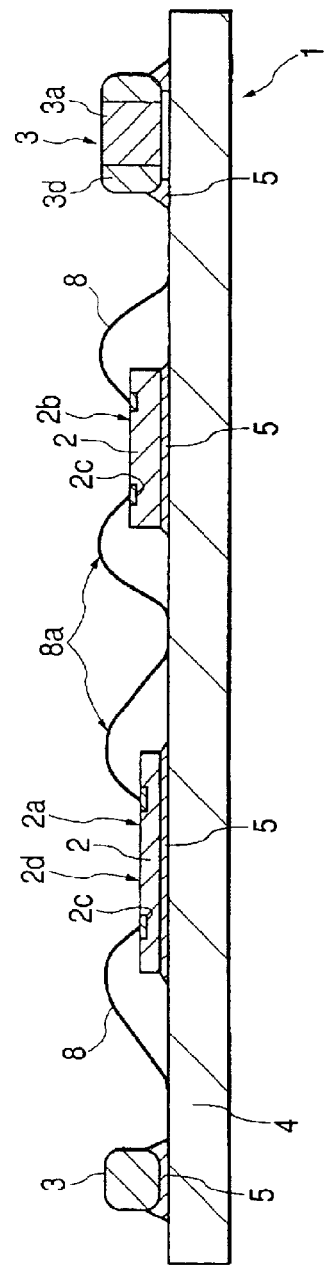
FIG. 2(a)
FIG. 2(b)

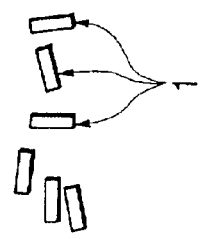
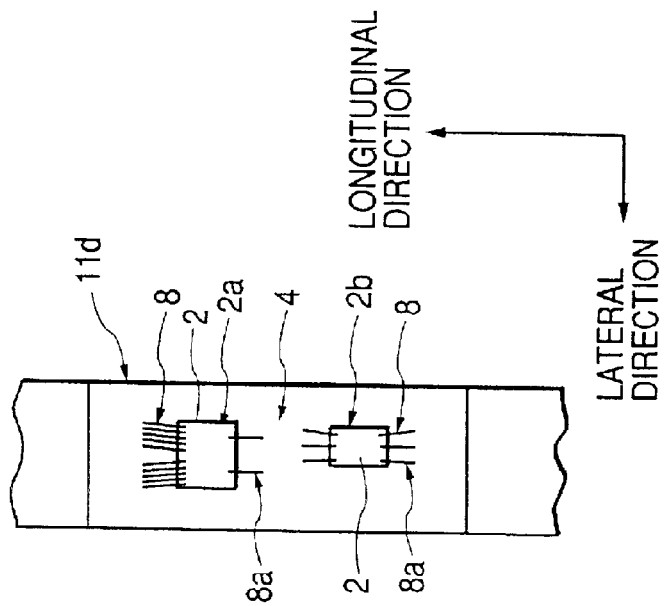
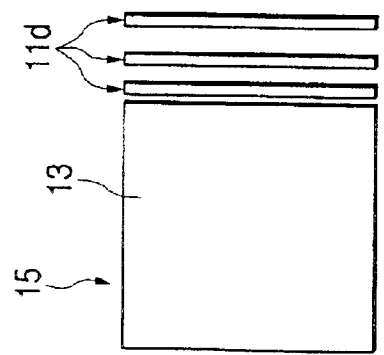

US 6,831,360 B2

SEMICONDUCTOR DEVICE HAVING AN ELASTIC RESIN WITH A LOW MODULUS OF ELASTICITY

BACKGROUND OF THE INVENTION

This invention concerns a semiconductor manufacturing technique and, more in particular, it relates to a technique useful when applied to a method of manufacturing a lithium cell monitoring module.

As an example of module products in which surface mounted chip parts such as chip capacitors or chip resistors and semiconductor chips for bear chip mounting (semiconductor device), those so-called lithium cell monitoring module have been developed. The chip parts and semiconductor chips are mounted on a module substrate by soldering connection, and both of them are protected by being covered with a highly elastic insulative resin.

The structure in which the chip parts (surface mounted parts) and the semiconductor chips are mounted and both of them are covered with a resin is described, for example, in Japanese Published Unexamined Patent Application No. 2000-223623 and No. Hei 11(1999)-238962.

At first, Japanese Published Unexamined Patent Application No. 2000-223623 describes a technique of making the modulus of elasticity of a first resin that covers wire bonded semiconductor chips and wires thereof greater than the modulus of elasticity of a second resin that covers the outside thereof to make the first resin harder than the second resin to suppress deformation of the first resin by thermal stresses thereby preventing disconnection of the wires.

Further, Japanese Published Unexamined Patent Application No. Hei 11(1999)-238962 describes a technique of connecting a semiconductor device to a substrate by soldering connection by way of solder bumps and also solder connecting other surface mounted parts to the substrate and further covering the semiconductor device and other surface mounted parts with a silicone gel, without wire connection, thereby reducing the occupying area and the height of the module and reducing the loss.

SUMMARY OF THE INVENTION

However, the present inventor has found the following problems regarding the semiconductor device of a structure in which the chip parts (surface mounted parts) and the semiconductor chips are mounted and both of them are covered with resin.

That is, the semiconductor device (such as module products) are soldered by secondary mounting reflow to a mounting substrate such as a printed wiring substrate in which solder is melted again at the soldered parts (surface mounted parts) in the module to cause disadvantages such as short-circuit.

In this phenomenon, when the solder is melted again, the melt expanding pressure causes peeling at the boundary between the parts and the resin or at the boundary between the resin and the module substrate to which solder intrudes in flash to connect terminals on both ends of the surface mounted parts, leading to short-circuit.

As the countermeasure for the short-circuit, it may be considered a structure in which the internal solder does not melt in the secondary mounting reflow or a structure to moderate the melting expansion pressure of the solder even when it is melted, not to cause peeling at the boundary between the part and the resin or at the boundary between the resin and the module substrate.

In view of the above, as the former countermeasure, it may be considered to use a high melting solder for the internal solder. In this case, however, Sn—Pd solder is previously formed to the terminal of the surface mounted parts and, further, gold plating is applied to the terminals of the module substrate in a module to be applied with wire bonding. Accordingly, it has been found that since impurities such as Sn or gold is mixed with the internal solder and the melting point of the solder is lowered upon secondary mounting reflow of the module even if a high melting solder is used to melt the internal solder and, as a result, the use of the high melting solder is not effective.

On the other hand, as the latter countermeasure, it may be considered to use a gel resin of a low hardness (modulus of elasticity) to moderate the melting expansion pressure of the molten internal solder but this involves a problem that the protection function (mechanical strength) to the inside of the module is small.

In this case, while it is possible to protect by covering with a casing or a cap but this involves a problem of increasing the cost.

Further, it may also be considered to use a low melting solder upon secondary mounting reflow of the module, since the life of the low melting solder is short, it gives a problem of low reliability in a temperature cycle test.

Japanese Published Unexamined Patent Application No. 2000-223623 has neither the description for technique of covering the wire bonded surface mounted parts (semiconductor chips) with a resin of low modulus of elasticity nor the description of mentioning short-circuit caused by the melting expansion pressure of the internal solder upon secondary mounting reflow of the module as a problem.

Further, Japanese Published Unexamined Patent Application No. Hei 11(1999)-238962 describes a structure of covering the solder connected semiconductor devices or other surface mounted parts with a gel resin of low modulus of elasticity, but it neither contains description for an actual allowable range for the modulus of elasticity of the gel resin nor contains description that points out the short-circuit problem caused by the melting expansion pressure of the internal solder upon secondary mounting reflow of the module. Further, it describes a structure covering the outside of the gel resin with a casing, but the use of the casing gives a problem of increasing the cost.

This invention intends to provide a semiconductor device capable of preventing short circuit caused by flowing out of a solder by re-melting in the semiconductor device, as well as a manufacturing method thereof.

This invention further intends to provide a semiconductor device for reducing the cost, as well as a manufacturing method thereof.

This invention further intends to provide a semiconductor device capable of coping with Pb free trend and a manufacturing method thereof.

These and other objects and novel features of this invention will become apparent by reading the description of the specification and the appended drawings.

Outlines of the typical inventions among those disclosed in the present application are simply explained below.

That is, the semiconductor device according to this invention comprises surface mounted parts mounted by soldering, a wiring substrate on which the surface mounted parts are mounted, solder connection portions for connecting the surface mounted parts to the wiring substrate, and a sealing portion formed with an elastic insulative resin for covering the surface mounted parts and the solder connection portions, in which the elastic resin is a resin having a modulus of elasticity of 200 MPa or less at a temperature of 150° C. or higher.

According to this invention, even when internal solder connection portions are melted again upon mounting the semiconductor device in secondary mounting reflow, the pressure caused by the melting expansion can be moderated with the elastic resin and, as a result, it can prevent peeling at the boundary between the surface mounted parts and the resin, or at the boundary between the resin and the module substrate.

This can prevent flow out of the solder to the boundary to prevent occurrence of short circuit between terminals in the surface mounted parts.

Further, the semiconductor device according to this invention comprises a surface mounted parts to be solder mounted, a wiring substrate on which the surface mounted parts are mounted, solder connection portions for connecting the surface mounted parts to the wiring substrate, and a sealing portion formed with a silicone resin as an elastic insulative resin for covering the surface mounted parts and the solder connection portions.

Further, the semiconductor device according to this invention comprises semiconductor chips as a surface mounted parts formed at the main surface thereof with surface electrodes, chip parts as the surface mounted parts each formed with connection terminals on both ends thereof, a module substrate as a wiring substrate on which the semiconductor chips and the chip parts are mounted, solder connection portions for connecting the chip parts to the wiring substrate, and a sealing portion formed of a silicone resin which is an elastic insulative resin for covering the semiconductor chips, the chip parts and the solder connection portions.

Further, the semiconductor device according to this invention comprises semiconductor chips as the surface mounted parts each formed at the main surface with a surface electrode, chip parts as the surface mounted parts each formed with connection terminals on both ends, a module substrate as a wiring substrate on which the semiconductor chips and the chip parts are mounted, solder connection portions for connecting the chip parts to the wiring substrate, and a sealing portion formed of an insulative resin having a modulus of elasticity of 1 MPa or more and 200 MPa or less at a temperature of 150° C. or higher and having a modulus of elasticity of 200 MPa or more at a temperature of 25° C., for covering the semiconductor chips, the chip parts and the solder connection portions.

Further, the method of manufacturing the semiconductor device according to this invention includes a step of mounting surface mounted parts by soldering connection to a wiring substrate and a step of covering and resin encapsulating the solder connection portions formed by the soldering connection and the surface mounted parts with an elastic insulative resin having a modulus of elasticity of 200 MPa or less at a temperature of 150° C. or higher.

Further, the method of manufacturing a semiconductor device according to this invention comprises:

a step of providing a substrate to prepare multiple segments in which plural device regions are partitioned and formed by partition lines; a step of mounting surface mounted parts to the device regions by solder connection; a step of collectively covering and resin encapsulating the solder connection portions of plural device regions formed by solder connection and the surface mounted parts with an elastic insulative resin and forming a collective sealing portion on the substrate to prepare multiple segments; a step of forming cut-in portions on the surface of a collective sealing portion along divisional lines corresponding to and on the opposite side of the partition lines of the substrate to prepare plural segments; and a step of dividing the substrate to prepare multiple segments along the division lines and dividing the collective sealing portion by cut-in portions into individual segments.

A method of manufacturing a semiconductor device according to this invention comprises: a step of providing a substrate to prepare multiple segments in which plural device regions are partitioned and formed by partition lines; a step of mounting surface mounted parts to the device regions by solder connection; a step of collectively covering and resin encapsulating the solder connection portions of plural device regions formed by solder connection and the surface mounted parts with an elastic insulative resin and forming a collective sealing portion on the substrate to prepare multiple segments; a step of applying identification marks by laser on every device regions on the surface of the collective sealing portion; and a step of dividing the substrate to prepare plural segments into segments along division lines corresponding to and on the opposite side of the partition lines.

A method of manufacturing a semiconductor device according to this invention comprises: a step of providing a substrate to prepare multiple segments in which plural device regions are partitioned and formed by partition lines; a step of mounting surface mounted parts to the device regions by solder connection; a step of applying printing by using a squeezer so as to collectively cover solder connection portions of plural device regions formed by solder connection and the surface mounted parts with an elastic insulative resin, thereby forming a collective sealing portion on the substrate to prepare multiple segments; and a step of dividing the substrate to prepare plural segments into individual segments along division lines corresponding to and on the opposite side of the partition lines.

A method of manufacturing a semiconductor device according to this invention comprises: a step of providing a substrate to prepare multiple segments in which plural rectangular device regions are partitioned by partition lines; a step of mounting chip parts and semiconductor chips as the surface mounted parts by solder connection to the device region; a step of wire bonding the surface electrodes of the semiconductor chips and the substrate terminals of the device regions of the substrate to prepare multiple segments by forming wire loops of gold wires in the direction parallel with the longitudinal direction of the device regions; a step of collectively covering and resin encapsulating the solder connection portions of the plural device regions formed by the soldering connection and the surface mounted parts with an elastic insulative resin thereby forming a collective sealing portion on the substrate to prepare plural segments; and a step of primarily dividing the substrate to prepare multiple segments with division lines along the longitudinal direction of the device region and corresponding to and opposite side on the partition lines and secondarily dividing one row segment group formed by the primary division along the division lines in parallel with the lateral direction thereof into individual segments.

BRIEF DESCRIPTION OF THE DRAWINGS

FIG. 1(a) and FIG. 1(b) are views each showing a structure of an Li ion cell monitoring module which is an example of a semiconductor device as a preferred embodiment of this invention in which FIG. 1(a) is a perspective view and FIG. 1(b) is a bottom view;

FIG. 2(a) and FIG. 2(b) are views each showing an arrangement of surface mounted parts mounted on the Li ion cell monitoring module shown in FIG. 1, in which FIG. 2(a) is a plane arrangement view and 2(b) is a cross sectional view along A—A in FIG. 2(a);

FIGS. 3(a) and 3(b) are examples of a solder connection structure of a chip capacitor in the surface mounted parts shown in FIG. 2 in which FIG. 3(a) is a cross sectional view and FIG. 3(b) is an enlarged fragmentary cross sectional view showing a portion B in FIG. 3(a);

FIGS. 9(a), 9(b) and 9(c) are views showing an example for a method of dividing a substrate in assembling the Li ion cell monitoring module shown in FIG. 1 in which FIG. 9(a) is a plan view and a bottom view of a substrate before division, FIG. 9(b) is a plan view for one row division (primary division) and FIG. 9(c) is a plan view for secondary division (individual segmentation);

FIGS. 12(a), 12(b) and 12(c) are views showing an example of a cut in structure of a silicone resin in assembling the Li ion cell monitoring module shown in FIG. 1 in which FIG. 12(a) is a substrate-resin perspective view, FIG. 12(b) is a perspective view for the cut in portion and FIG. 12(c) is a perspective view for the groove formed by laser;

FIGS. 14(a), 14(b) and 14(c) are views showing an example of a method of dividing a substrate in assembling the Li ion cell monitoring module shown in FIG. 1 in which FIG. 14(a) is a plan view upon one row division (primary division), FIG. 14(b) is a enlarged fragmentary planar view for FIG. 14(a) and FIG. 14(c) is a planar view upon secondary division;

FIGS. 15(a) and 15(b) are process flow charts showing an example of an assembling method and mounting procedures the secondary mounting step of the Li ion cell monitoring module shown in FIG. 1 in which FIG. 15(a) is a flow chart for assuming and FIG. 15(b) is a flow chart for mounting;

DETAILED DESCRIPTION OF PREFERRED EMBODIMENTS

Figure 1A:
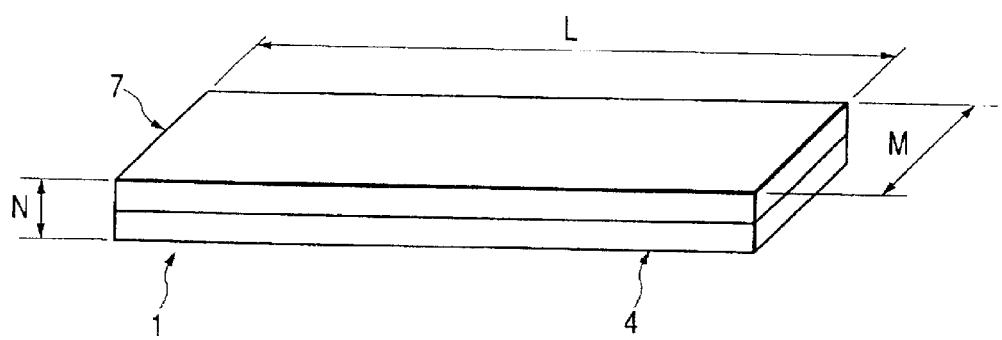

In the following preferred embodiments, explanation for identical or similar portions are not repeated unless it is particularly required.

Further, in the following preferred embodiments, when number and the like of elements (including number, numerical value, amount and range) are referred to, the invention is not restricted to a specified number and it may be more or less than the specified number excepting for the case of specifically described or when it is apparently restricted to the specified number in view of the principle.

Further, in the following preferred embodiments, the constituent elements (including elemental steps) are not always essential except for the case where they are particularly specified or where they are apparently essential in principle.

In the same manner, when the shape, positional relationship of the constituent elements are referred to, those substantially equal or similar with the shape and the like are also included excepting for the case where they are particularly specified and in a case where they should apparently be excluded in view of the principle. This is applicable also to the numeral value and the range described above.

Preferred embodiments of this invention will be explained specifically with reference to the drawings. Through out the drawings for explaining the preferred embodiments, those members having the same functions carry the identical reference numerals, for which duplicate explanations are to be omitted.

Figure 1B:
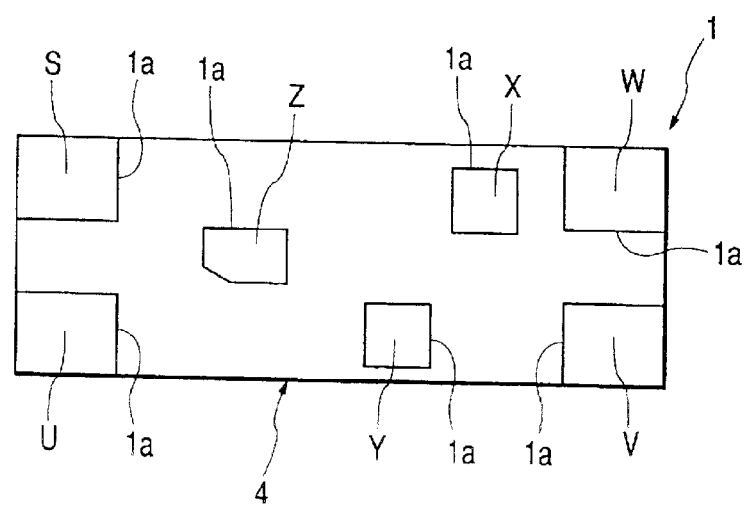
Figure 3A:
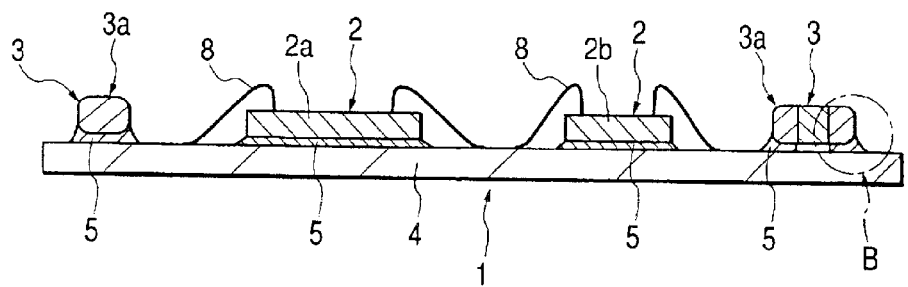
Figure 3B:
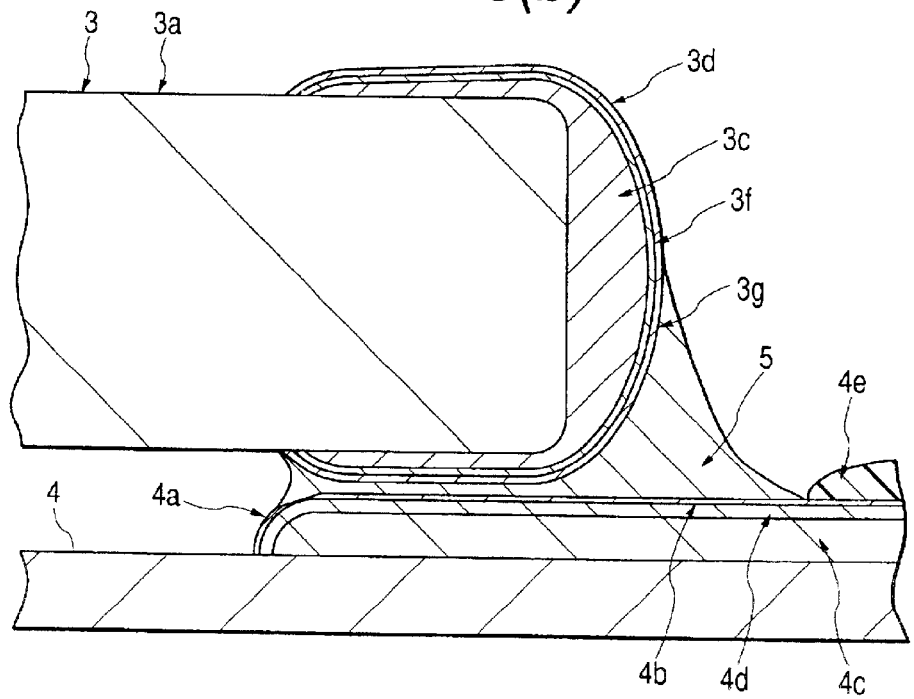
Figure 4:
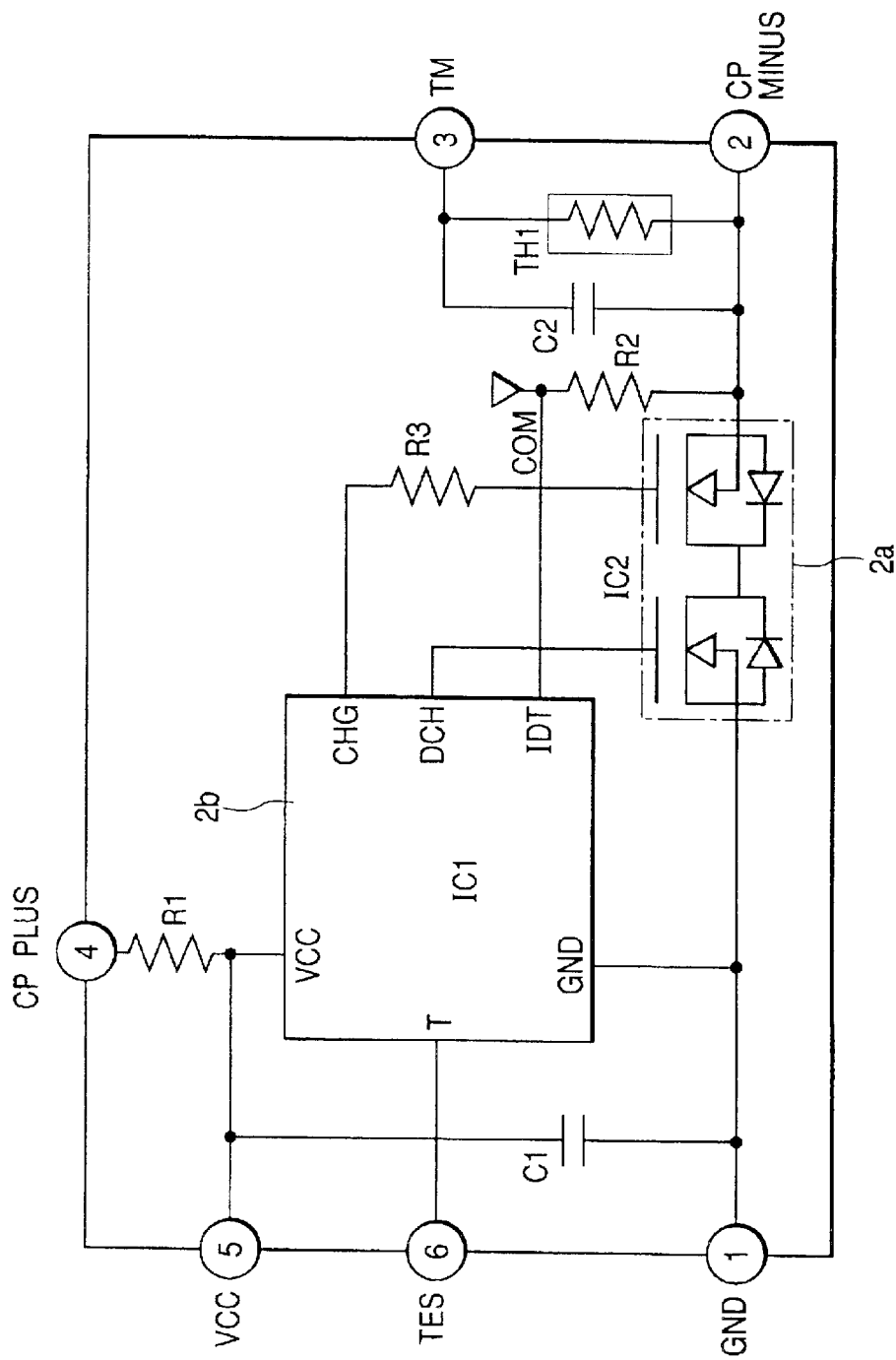
FIG. 4 is a circuit diaphragm showing an example of a circuit for the Li ion cell monitoring module in FIG. 1.
Figure 5:
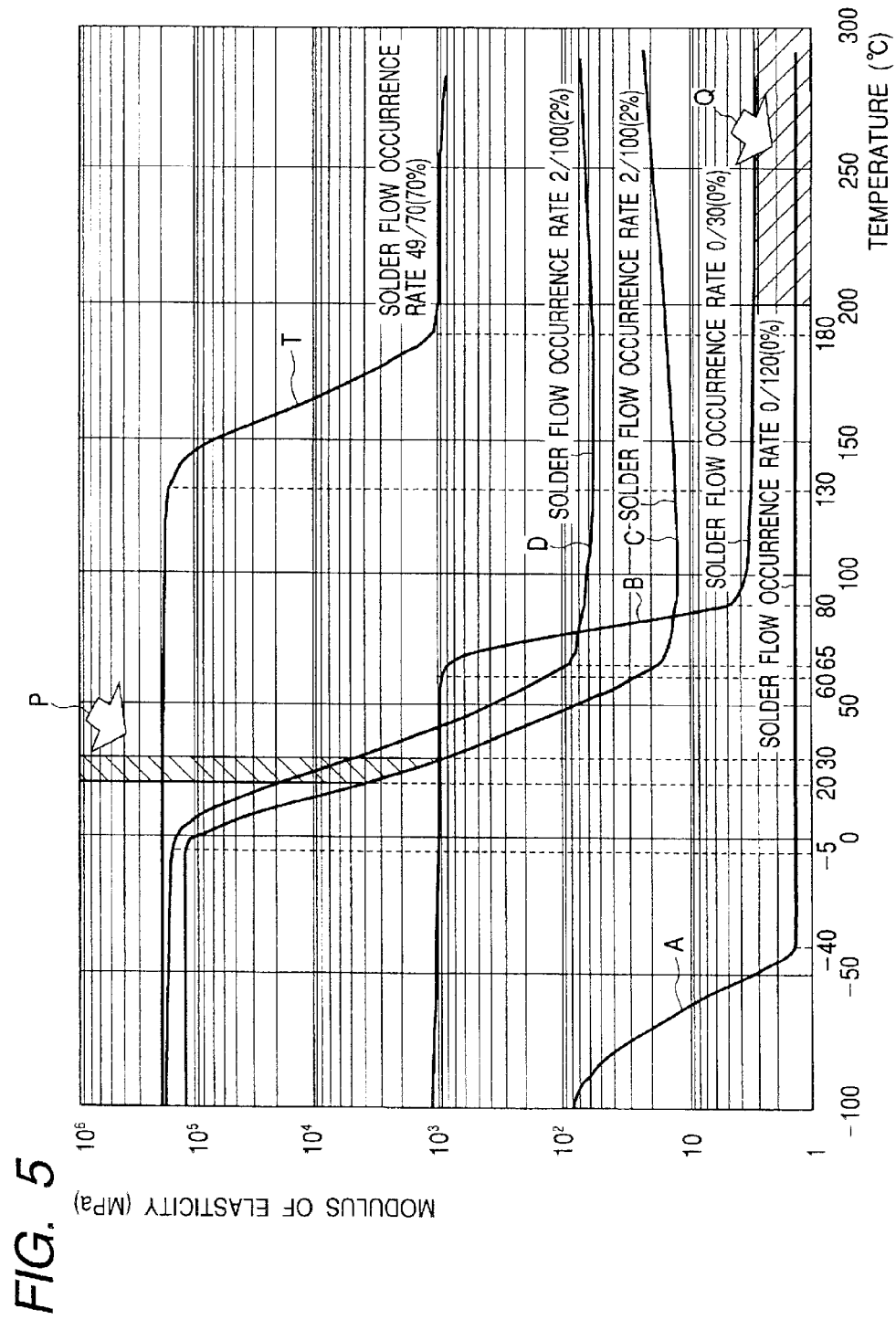
FIG. 5 is a characteristic graph showing an example of a temperature characteristics of a low elasticity resin used for a sealing portion of the Li ion cell monitoring module shown in FIG. 1.
Figure 6:
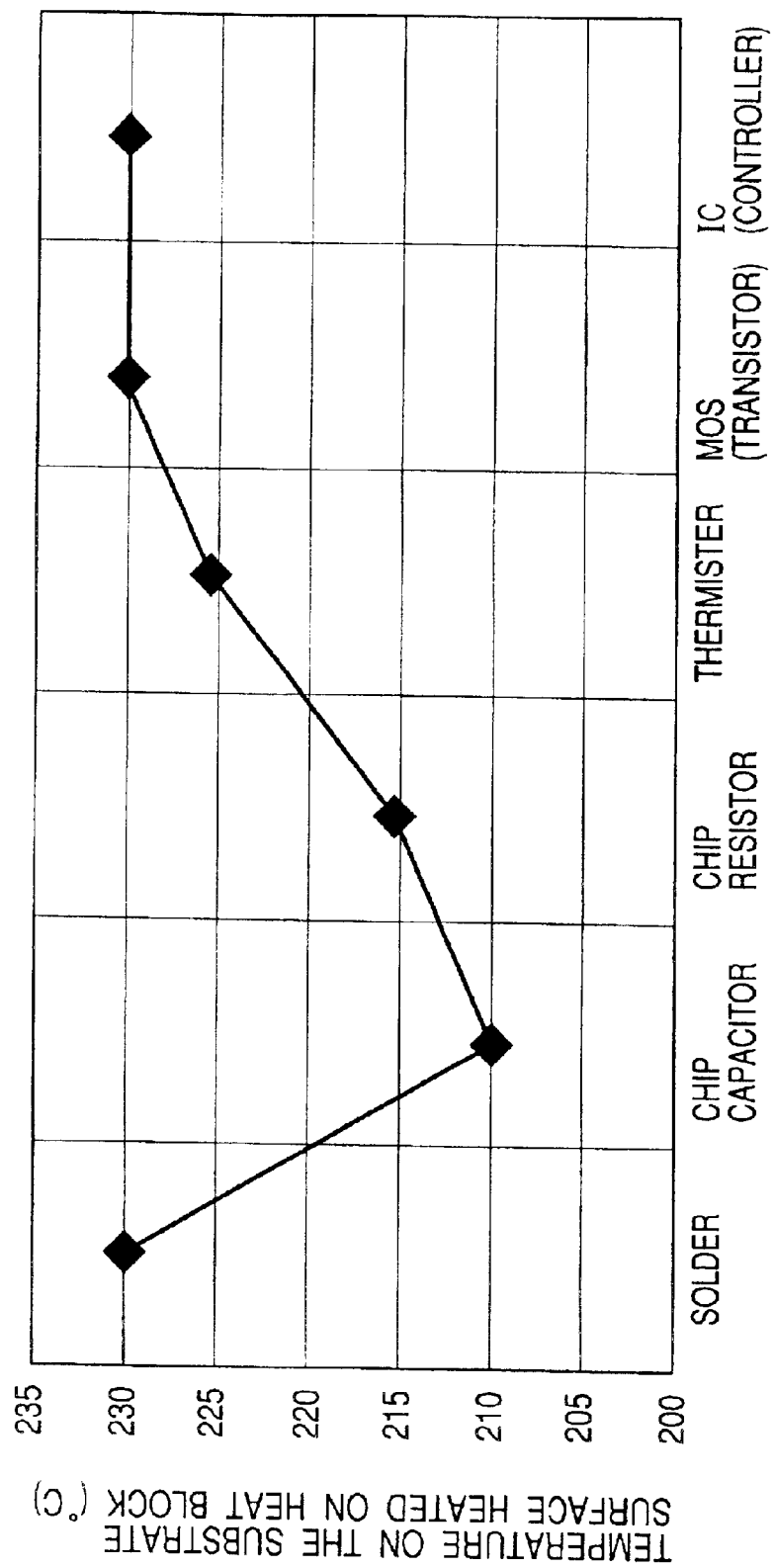
FIG. 6 is a graph for melting point data showing an example of a melting point for each of surface mounted parts in the Li ion cell monitoring module shown in FIG. 1.
Figure 7:
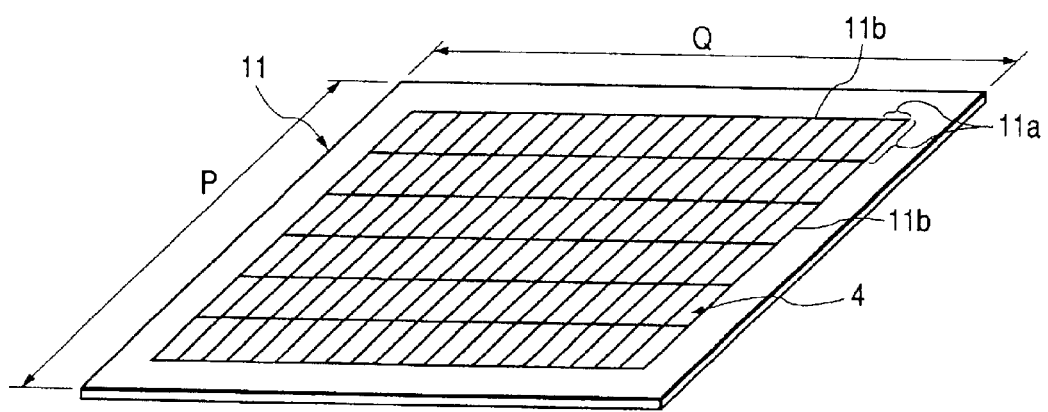
FIG. 7 is a perspective view showing a structure of a multi-layered ceramic substrate as an example of a substrate for preparing multiple segments used for assembling the Li ion cell monitoring module shown in FIG. 1.
Figure 8:
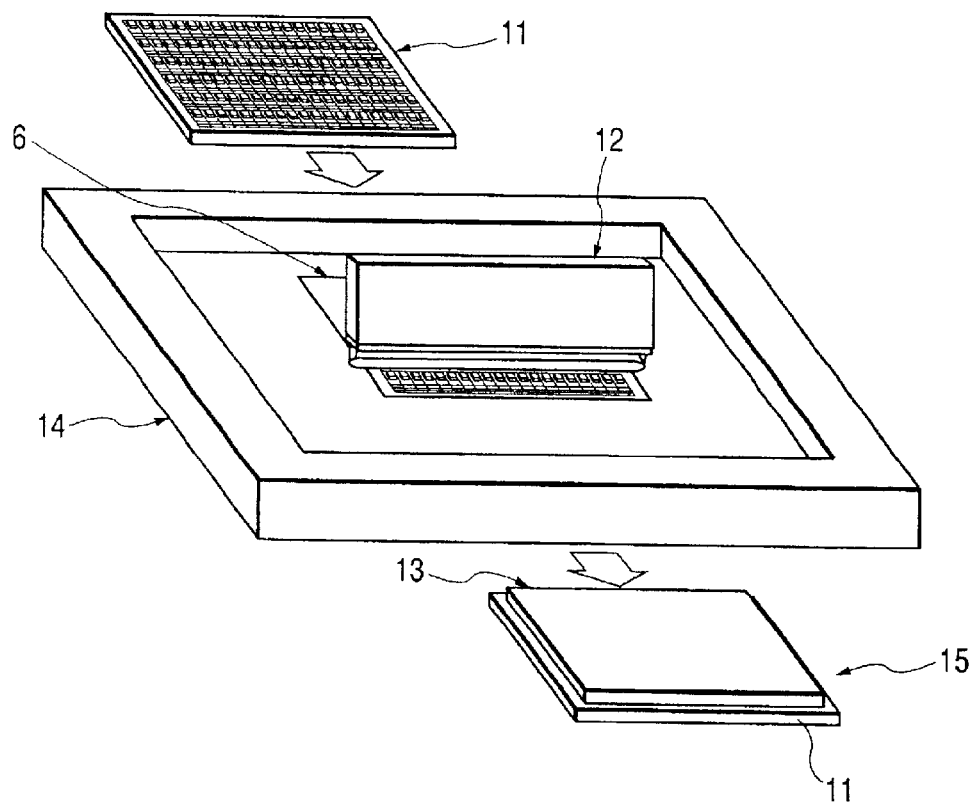
FIG. 8 is a perspective view showing an example of a resin printing method in the assembling of the Li ion cell monitoring module shown in FIG. 1.
Figure 9:
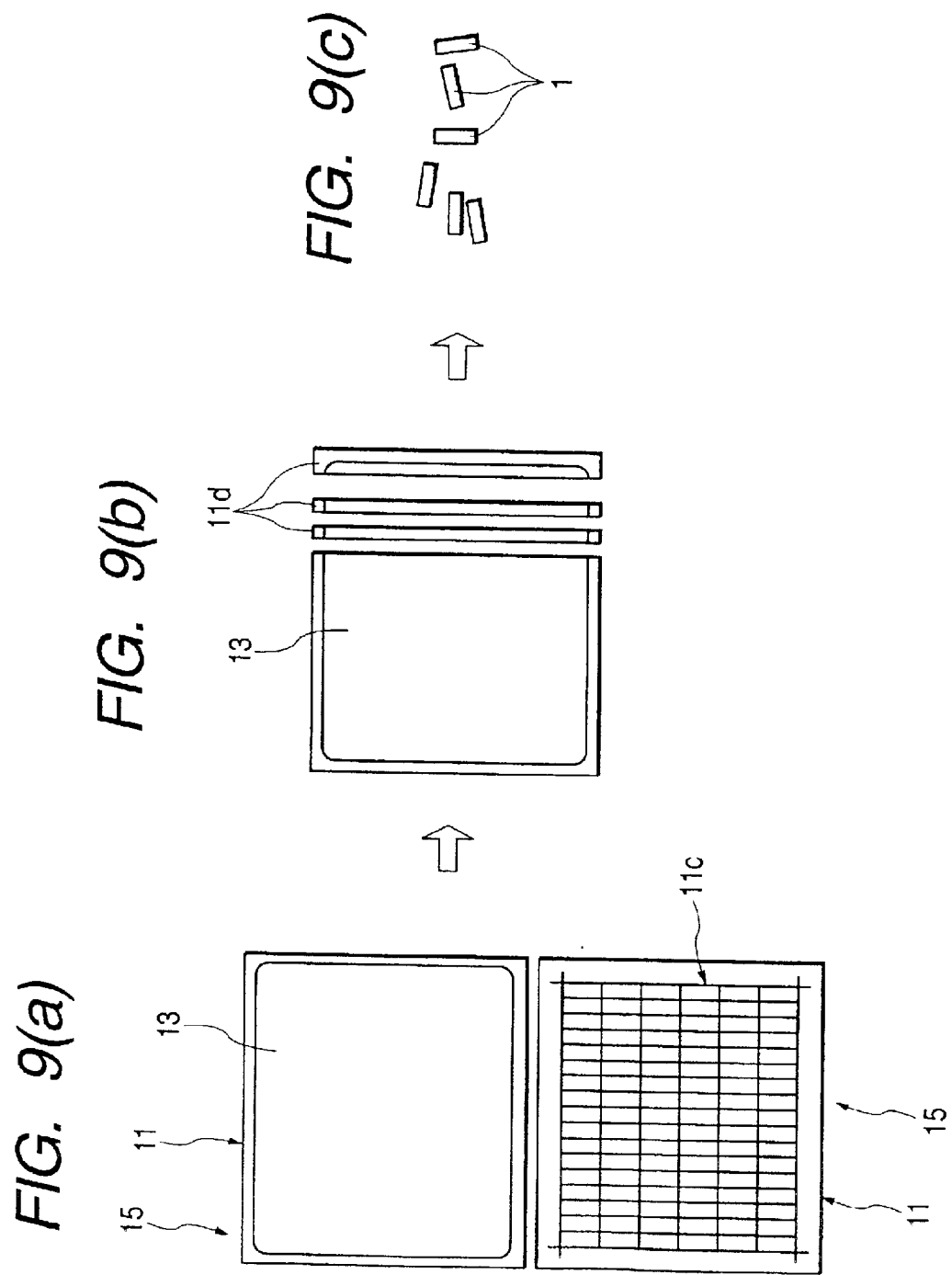
Figure 10:
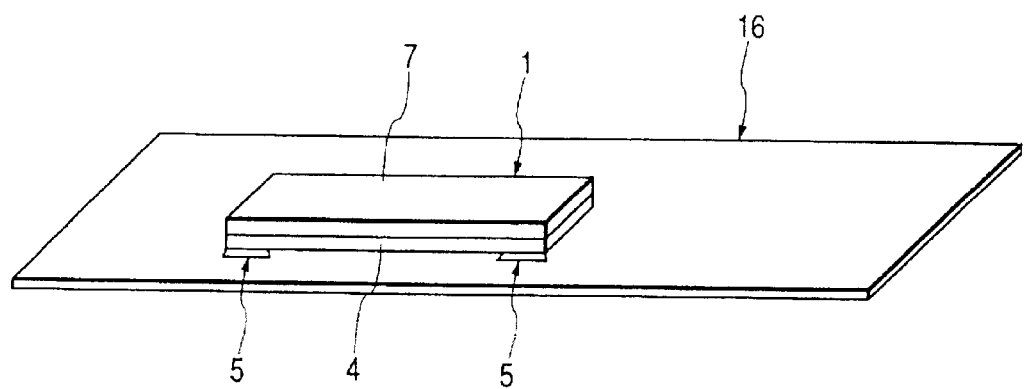
FIG. 10 is a perspective view showing an example of a mounting state of the Li ion cell monitoring module shown in FIG. 1 to a mounting substrate.
Figure 11:
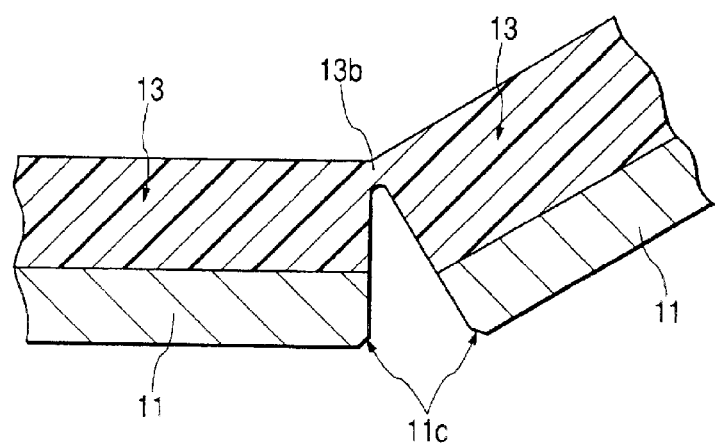
FIG. 11 is an enlarged fragmentary cross sectional view showing an example of a silicone resin residue upon division of a substrate in assembling the Li ion cell monitoring module shown in FIG. 1.
Figure 12A:
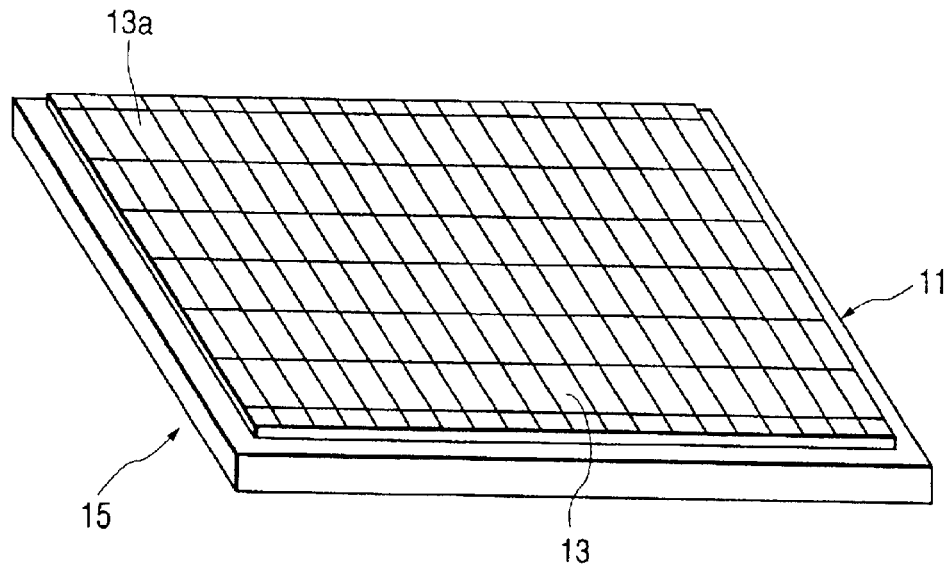
Figure 12B:
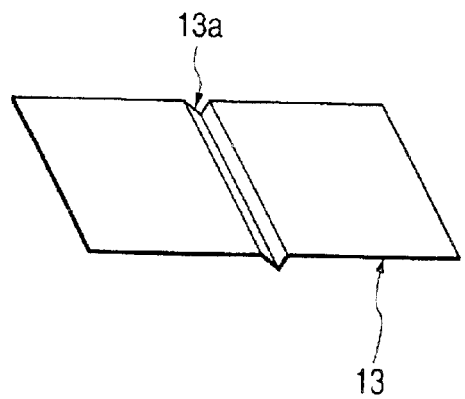
Figure 12C:
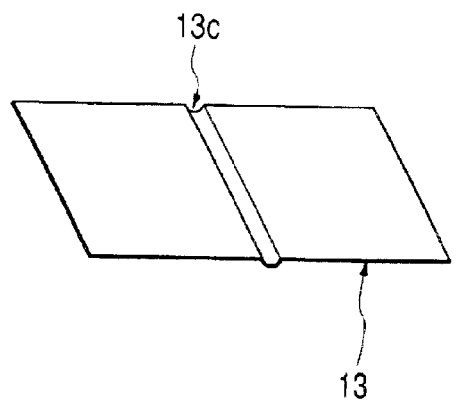
Figure 13:
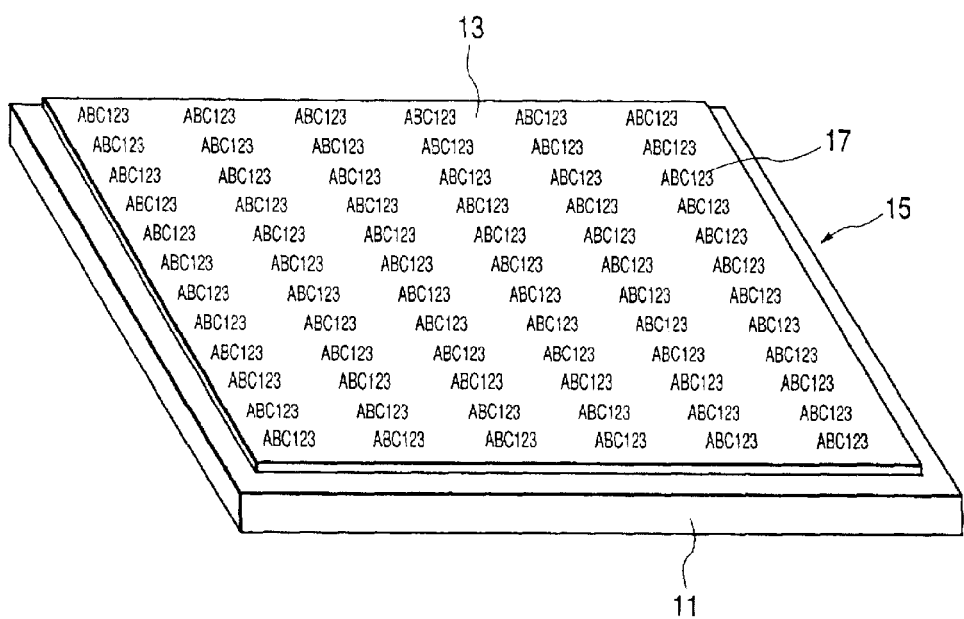
FIG. 13 is a perspective view showing an example of a marking method in assembling the Li ion cell monitoring module shown in FIG. 1.
Figure 15A:
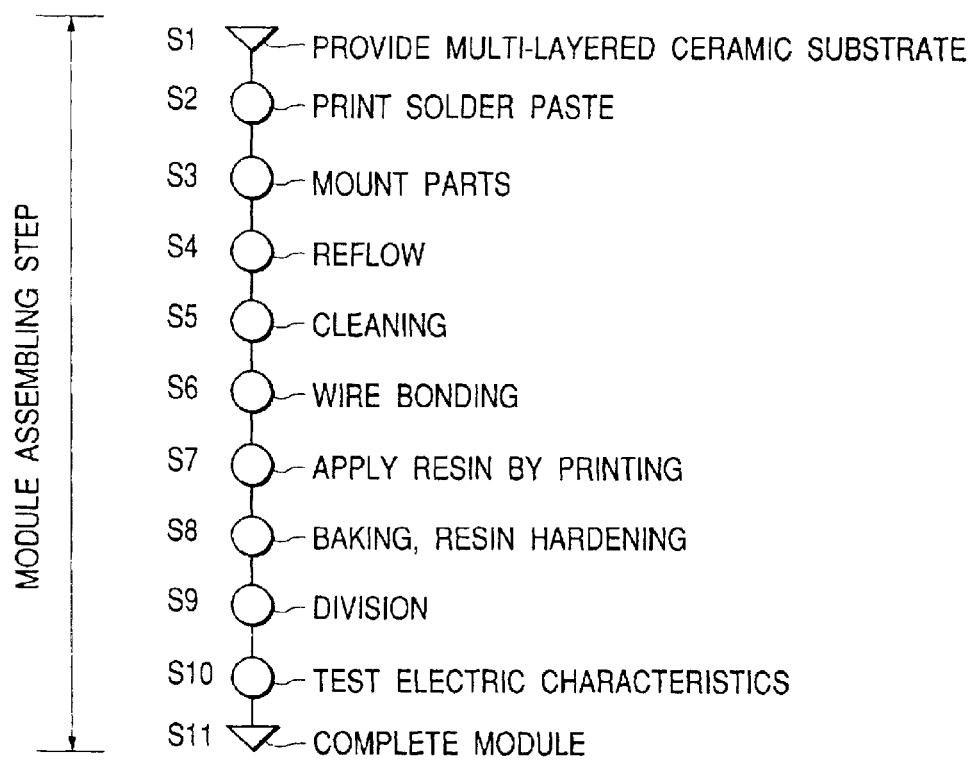
Figure 15B:
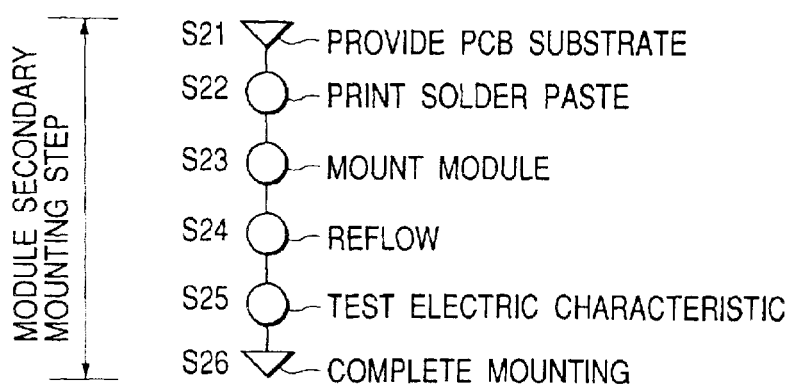
Figure 16:
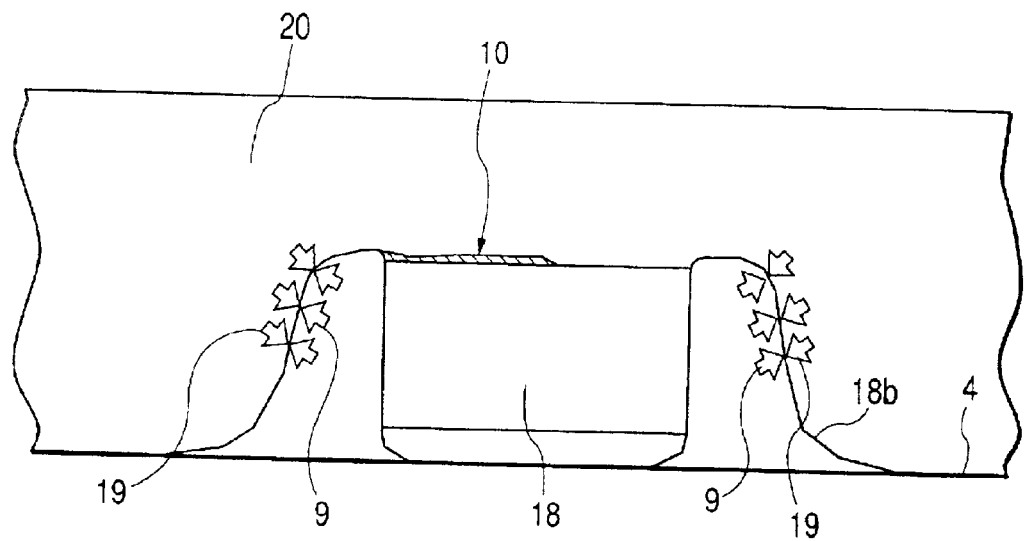
FIG. 16 is an explanatory view for flowing out showing a principle of solder flow in a module of a comparative example relative to the Li ion cell monitoring module shown in FIG. 1.
Figure 17:
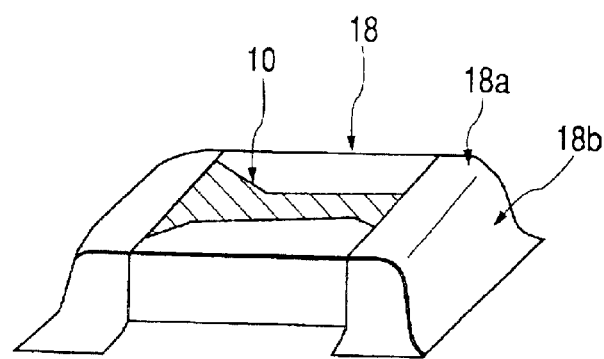
FIG. 17 is a perspective view showing an example of a solder flow in a module of the comparative example shown in FIG. 16.

FIGS. 1(a) and 1(b) are views each showing a structure of an Li ion monitoring module as an example of a semiconductor device of a preferred embodiment according to this invention in which FIG. 1(a) is a perspective view and FIG. 1(b) is a bottom view, FIGS. 2(a) and 2(b) are views each showing an arrangement of surface mounted parts mounted on the Li ion monitoring module shown in FIG. 1, in which FIG. 2(a) is a planar arraignment view and FIG. 2(b) is a cross sectional view along A—A in FIG. 2(a), FIGS. 3(a) and 3(b) are views each showing an example of a solder connection structure of a chip capacitor in the surface mounted parts shown in FIG. 2 in which FIG. 3(a) is a cross sectional view and FIG. 3(b) is an enlarged fragmentary cross sectional view showing a portion B in FIG. 3(a), FIG. 4 is a circuit diaphragm showing an example of a circuit for the Li ion cell monitoring module in FIG. 1, FIG. 5 is a characteristic graph showing an example of a temperature characteristics of a low elasticity resin used for a sealing portion of the Li ion cell monitoring module shown in FIG. 1, FIG. 6 is a graph for melting point data showing an example of a melting point for each of surface mounted parts in the Li ion monitoring module shown in FIG. 1, FIG. 7 is a perspective view showing a structure of a multi-layered ceramic substrate as an example of a substrate for preparing multiple segments used for assembling the Li ion monitoring module shown in FIG. 1, FIG. 8 is a perspective view showing an example of a resin printing method in the assembling of the Li ion monitoring module shown in FIG. 1, FIGS. 9(a) to 9(c) are views each showing an example for a method of dividing a substrate in assembling the Li ion monitoring module shown in FIG. 1 in which FIG. 9(a) is a plan view and a bottom view of a substrate before division, FIG. 9(b) is a plan view for one row division (primary division) and FIG. 9(c) is a plan view for a secondary division (individual segmentation), FIG. 10 is a perspective view showing an example of a mounting state of the Li ion monitoring module shown in FIG. 1 to a mounting substrate, FIG. 11 is an enlarged fragmentary cross sectional view showing an example of a silicone resin residue upon division of a substrate in assembling the Li ion monitoring module shown in FIG. 1, FIGS. 12(a) to 12(c) are views each showing an example of a cut-in structure of a silicone resin in assembling the Li ion monitoring module shown in FIG. 1 in which FIG. 12(a) is a substrate-resin perspective view, FIG. 12(b) is a perspective view for the cut-in portion and FIG. 12(c) is a perspective view for the groove formed by laser, FIG. 13 is a perspective view showing an example of a marking method in assembling the Li ion monitoring module shown in FIG. 1, FIGS. 14(a) to 14(c) are views each showing an example of a method of dividing a substrate in assembling the Li ion monitoring module shown in FIG. 1 in which FIG. 14(a) is a plan view upon one row division (primary division) and FIG. 14(b) is a enlarged fragmentary plant view for FIG. 14(a) and FIG. 14(c) is a plan view upon secondary division, FIGS. 15(a) and 15(b) show process flow charts each showing an example of mounting procedures in the assembling method and the secondary mounting step of the Li ion monitoring module shown in FIG. 1 in which FIG. 15(a) is a flow chart for assuming and FIG. 15(b) is a flow chart for mounting, FIG. 16 is an explanatory view for flowing out showing the principle of solder flow in a module of comparative example relative to the Li ion monitoring module shown in FIG. 1. and FIG. 17 is a perspective view showing an example of a solder flow in a module of a comparative example shown in FIG. 16.

A semiconductor device of this embodiment shown in FIG. 1 is a module product referred to as an Li (lithium) ion cell monitoring module 1 in which surface mounted parts are mounted by soldering on a module substrate 4 and the surface mounted parts are covered with a sealing resin, which is mainly incorporated into a small sized portable electronic equipments such as a portable telephone.

The function of the Li ion monitoring module 1 is, for example, to turn off the circuit just before occurrence of abnormality upon short-circuit or over-charging in a portable telephone thereby preventing electric damages in battery cells.

The Li ion monitoring module 1 comprises, as shown in FIG. 2, a semiconductor chip 2 as a surface mounting part formed with plural pads (surface electrodes) 2c on a main surface 2d, chip parts 3 as surface mounting pads each formed with connection terminals 3d on both ends, a module substrate 4 as a wiring substrate on which the semiconductor chip 2 and the chip parts 3 are mounted, solder connection portions 5 for connecting the chip parts 3 and substrate terminals 4a of the module substrate 4 by means of soldering, gold wires 8 for connecting the pads 2c of the semiconductor chip 2 and the substrate terminal 4a of the corresponding module substrate 4 and a sealing portion 7 shown in FIG. 1 formed with a low elasticity resin (elastic resin) 6 shown in FIG. 8 such as an insulative silicone resin or a low elasticity epoxy resin for covering the semiconductor chip 2, the chip parts 3, the solder connection portions 5 and the gold wires 8.

That is, the chip parts to be solder connected on the module substrate 4 are covered with the low elasticity resin 6 and thereby the solder re-melting expansion pressure 9 in the solder connection portions 5 formed upon secondary reflow (reflow to the mounting substrate at the shipping destination) (refer to Comparative Example in FIG. 16) can be moderated to prevent peeling at the boundary between the chip part 3 and the sealing portion 7 and at the boundary between the sealing portion 7 and the module substrate 4 and prevent flow out 10 of the solder to the boundary.

The low elasticity resin 6 is a low elasticity and insulative resin having both a protective function capable of protecting the interior parts (mechanical strength) and a flexibility capable of moderating the solder re-melting expansion pressure 9 shown in FIG. 16. A silicone resin (silicone rubber) A or low elastic epoxy resins B, C and D having the modulus of elasticity shown in FIG. 5 are preferred but existent high elasticity epoxy resin T is not suitable.

Then, the allowable range for the modulus of elasticity of the low elasticity resin 6 (resins A, B, C, D shown in FIG. 5) of this embodiment is preferably a modulus of elasticity of 200 MPa or less at a temperature of 150° C. or higher while considering high temperature, that is, temperature for the secondary reflow (generally, about 230° C.) or condition of high temperature applied in a temperature cycle test (for example, −40 to +125° C.).

This is a modulus of elasticity capable of moderating the solder re-melting expansion pressure 9 upon melting of the solder at the inner solder connection portions at a high temperature of 150° C. or higher derived from FIG. 5, in which the resins A, B, C and D are within the range but the resin T is out of the range and not suitable.

Further, the low elasticity resin 6 preferably has a modulus of elasticity of 1 MPa or more at a temperature of 150° C. or higher and the resins A, B, C and D are within the range as shown in FIG. 5.

This is determined considering the result of a test for protecting the surface mounted parts in the inside of the sealing portion 7 that they can be protected so long as the modulus of elasticity is 1 MPa or more.

Further, it should has a modulus of elasticity of at least 1 MPa like in the above in the same manner as described above also at a temperature of actual use (normal temperature: 25° C.) and resins A, B, C and D are within the range as shown in FIG. 5.

Further, it is further preferred that the resin has a modulus of elasticity of 200 MPa or more in order to enhance the protection effect for the surface mounted parts at a temperature of actual use (normal temperature: 25° C.) and the resins B, C and D are within the range but the resin A is out of the range as shown in FIG. 5.

However, also the resin A has a modulus of elasticity of 1 MPa or more, there is no particular problem.

In FIG. 5, the rate of occurrence of solder flow out for each of the resins shows the number of failed parts and percentage thereof when electrical short-circuit test is conducted for the chip parts 3 when conducting reflow at 260° C. in which a generator represents the number of test while the fraction represents the number of failed parts.

According to the test, while rate of the occurrence of failure is extremely low as 0 to 2% in the resins A, B, C and D, the rate of occurrence of failure is as high as 70% in the resin T which is not suitable.

In the reliability test by the temperature cycle, no particular problems occur for the resins A, B, C and D.

When the silicone resin (resin A) is adopted, for example, as the low elasticity resin, the modulus of elasticity of the resin is most preferably within a range from 2 to 4 MPa considering the margin for the module reflow temperature and the mechanical strength (protective function) collectively.

In other words, when the silicone resin (resin A) is adopted for instance, the shore hardness from A 70 to 80 is a most preferable range as the rubber hardness thereof when the margin for the module reflow temperature and the mechanical strength (protection function) are considered collectively.

In FIG. 5, a region P (hatched area) shows an optimal region in the dividing performance of the low elasticity resin 6 when a multi-layered ceramic substrate 11 as a substrate to prepare multiple segments shown in FIG. 7 is divided into individual segments and a region Q (hatched area) shows a safety region for the reflow resistance of the low elasticity resin 6.

Further, in the low elasticity epoxy resins B, C and D shown in FIG. 5, content, for example, of silica contained in each of them is different and their characteristics are also different to some extent depending on the content.

The size of the Li ion monitoring module 1 in this embodiment is, as shown in FIG. 1(a), is small as about : length (L)=8 to 12 mm, width (M)=3 to 5 mm, height (H)=1.6 mm (MAX). Further, seven external terminals 1a are disposed at the rear face thereof as shown in FIG. 1(b).

The pin functions for the seven external terminals 1a are, for example, GND for the terminal S, CP(−) for the terminal U, TM for the terminal V, CP(+) for the terminal W, VCC for the terminal X, TES for the terminal Y and COM for the terminal Z.

The module substrate 4 is formed, for example, of alumina ceramics.

Then, main surface mounted parts mounted on the Li ion monitoring module 1 of this embodiment are to be explained with reference to FIG. 2.

In the Li ion monitoring module 1 described above, two semiconductor chips 2 and six chip parts 3 are mounted as the surface mounted parts on the module substrate 4 as shown in FIG. 2(a).

One of the two semiconductor chips 2, one is a 2-channel transistor 2a and the other is a controller 2b for the monitoring function to control the 2-channel transistor 2a.

Both of them are fixed by the solder connection portions 5 using solder to the substrate terminal 4a of the module substrate 4 as shown in FIG. 2(b). That is, both of the two semiconductor chips 2 are solder connected to the substrate terminal 4a by using solder as a die bonding material.

Further, both of them are connected by way of the gold wires 8 to the substrate terminals 4a of the module substrate 4 in which gold wires 8, for example, of 50 μm diameter are use for the 2 channel transistor 2a while gold wires 8, for example, of 27 μm diameter are used for the controller 2b.

Further, among the six chip parts 3, three chips are chip resistors 3b, two chips are ceramic chip capacitors 3a and one chip is a chip thermister 3c each of which has connection terminals 3d on both ends respectively and each of the connection terminals 3d is solder connected with the substrate terminal 4a at the solder connection portion 5.

Since the semiconductor chip 2 is wire bonded by using the metal wires 8, a gold plating layer 4b is formed on the surface of each of the substrate 4a as shown in FIGS. 3(a) and 3(b) and, accordingly, each of the chip parts 3 is also solder connected to the substrate terminal 4a formed at the surface with the gold plating layer 4b.

As shown in FIG. 3(b), the connection terminal 3d for the chip part 3 comprises, for example, an AG—PD electrode 3e, and an Ni underlying plating layer 3f and a solder plating layer 3g orderly from the lower surface and the substrate terminal 4a comprises a Cu member 4c, an Ni under plating layer 4d and a gold plating layer 4b orderly from the lower layer and, further, the region of the substrate terminal 4a other than the place to form the solder connection portion 5 is covered with an overcoat glass 4e as an insulative film (solder resist film).

Accordingly, in the module substrate 4, the gold plating layer 4b is formed on the surface for all the substrate terminals 4a, and the chip part 3 is solder connected at the connection terminal 3d with the gold plating layer 4b, and the semiconductor chip 2 is connected at the pad 2c with the gold wires 8 and the gold wires 8 are in turn connected with the gold plating layer 4b on the surface of the substrate terminal 4a.

In this case, wire loops 8a of the gold wires 8 shown in FIG. 2(b) are bonded so as to be formed in the direction substantially parallel with the longitudinal direction of a rectangular module substrate 4 as shown in FIG. 2(a).

That is, in the module substrate 4, the substrate terminals 4a are arranged such that they are wired in the direction substantially parallel with the longitudinal direction of the module substrate 4.

FIG. 6 shows melting points of the solder at each of the solder connection portions 5 in the eight surface mounted parts mounted on the module substrate 4 and the melting point of the solder alone. It can been seen from the graph that the melting point of the chip parts 3 (ceramic chip capacitor 3a, chip resistor 3b, chip thermister 3c) is lower.

Then, the operation of the circuit for the Li ion monitoring module 1 shown in FIG. 4 is to be explained.

In the Li ion monitoring module 1 shown in FIG. 1, the GND terminal is connected with a (−)terminal of a battery cell and forms an identical wiring with the VP-terminal connecting to a (−)terminal of a portable telephone by way of a 2-channel transistor 2a.

Accordingly, a wiring is a cathode wiring connecting the battery cell and the portable telephone.

Further, the 2 channel transistor 2a is a device for turning circuit to OFF upon occurrence of abnormality. Further, the controller 2b is a device for monitoring the potential at each of the wirings for controlling the 2channel transistor 2a.

Now referring to the actual operation of the circuit shown in FIG. 4 specially, the CHG terminal and the DCH terminal of the controller 2b (monitoring function IC) are at the potential of turning ON the 2 channel transistor 2a and current is supplied from the battery cell to the portable telephone (current flows from VP(−) to GND).

Then, when abnormality such as short-circuit or flow of large current occurs in the portable telephone, a slight potential difference is caused between the IDT terminal of the controller 2b and the GND terminal due to the voltage drop across the slight resistance of the 2 channel transistor 2a, and the potential at the DCH channel reaches a potential to turn OFF one of the channels of the 2 channel transistor 2a by detecting the potential difference.

This can interrupt the supply of current from the battery cell to prevent accidents.

Also during charging, both of the two channels of the 2 channel transistor 2a are in the ON state and current is supplied from the portable telephone to the battery cell (current flows from GND to VP(−)).

In a case of overcharging such as excess charging time, since the VCC terminal of the controller 2b is connected with the positive terminal of the battery cell, when the potential relative to GND exceeds a certain level, the potential at the CHG terminal reaches a potential which turns OFF one of the channels of the 2 channel transistor 2a by detecting the excess of the level.

This can stop the current supply from the charger by way of the potable telephone to the battery cell to prevent the accident.

Then, the method of manufacturing the semiconductor device (Li ion monitoring module 1) in this embodiment is to be explained in accordance with the procedures for assembling the module shown in FIG. 15(a).

At first, as shown in step S1, a multi-layered ceramic substrate 11 as a substrate to prepare multiple segments formed by parting the module region 11a comprising plural (for example about 120) device regions by partition lines 11b is provided.

As shown in FIG. 7, when the module regions 11a are formed by the number of 120 in the multi-layered ceramic substrate 11, the size of the substrate is, for example, about (P)80 mm×(Q)80 mm and thickness of about 0.5 mm. However, for the substrate to take multiple segments, a glass epoxy substrate other than the multi-layered ceramic substrate 11 can also be used.

A circuit shown in FIG. 4 is patterned in each of the module regions 11a and the gold plating layer 4b shown in FIG. 3(b) is formed on the surface of each of the substrate terminals 4a.

Successively, solder paste printing shown in step S2 is conducted and subsequently plural surface mounted parts are mounted by solder connection in each of the module regions 11a (step S3).

That is, after printing the solder paste to each of the substrate terminals 4a, surface mounted parts such as ceramic chip capacitors 3a, chip thermisters 3c, chip resister 3b and semiconductor chips 2 are arranged on predetermined substrate terminals 4a and, subsequently, reflow is conducted as shown in step S4 to solder connect each of the surface mounted parts.

The solder in the solder connection portion has a fillet shape as shown in FIG. 2(b).

Subsequently, cleaning shown in step S5 is conducted and, successively, wire bonding shown in step S6 is conducted.

Then, the pad 2c of the semiconductor chip 2 and the substrate terminal 4a in the module substrate 4 formed with the gold plating layer 4b at the surface thereof are wire bonded by using the gold wires 8.

In this case, the wire loops 8a of the gold wires 8 (refer to FIG. 2(b) are formed in the direction substantially parallel with the longitudinal direction of the rectangular module substrate 4 as shown in FIG. 2(a).

Subsequently, resin print coating shown in step S7 is conducted.

In this case, plural semiconductor connection portions 5 of the module substrate 4 formed by the solder connection, the two semiconductor chips 2 (2 channel transistor 2a and the controller 2b) and the six chip parts 3 (ceramic chip capacitor 3a, chip resistor 3b and a chip thermister 3c) are collectively covered by using an insulative low elasticity resin 6 such as a silicone resin or a low elasticity epoxy resin as shown in FIG. 5 and printing is conducted by using a squeezer 12 as shown in FIG. 8 to form a collective sealing portion 1 on the multi-layered ceramic substrate 11.

That is, as shown in FIG. 8, for the multi-layered ceramic substrate 11 completed with mounting of the parts and wire bonding, low elasticity resin 6 such as a silicone resin or a low elasticity epoxy resin is coated by a printing method so as to cover the plural module regions 11a collectively by the low elasticity resin 6, by using a metal mask 14 and a squeezer 12 to form a collective sealing portion 13.

Further, baking and resin curing shown in step S8 is conducted to form a resin coated substrate 15.

That is, the collective sealing portion 13 formed by the printing method is baked and cured to form the resin coated substrate 15.

Subsequently, division shown in step S9 is conducted to separate the multi-layered ceramics substrate 11 into individual segments.

In the method of manufacturing the Li ion monitoring module 1 in this embodiment, partition lines 11b shown in FIG. 7 are formed on the surface (part mounting side) of the multi-layered ceramic substrate 11 and, correspondingly, snap lines (division lines) 11c as small grooves for division are formed as shown in FIG. 9(a) and FIG. 11 on the opposite side (rear face) thereof, and the multi-layered ceramic substrate 11 is divided (into individual segments) along the snap lines 11c.

Thus, the multi-layered ceramic substrate 11 can easily be divided by a mechanical force.

In the division, a multi-layered ceramic substrate 11 formed with the collective sealing portion 13 shown in FIG. 9(a) is provided and, successively, 1 row division (primary division) shown in FIG. 9(b) is conducted to form 1 row segment group 11d and, subsequently, individual division (secondary division) shown in FIG. 9(c) is conducted to divide the same into individual modules.

After the division, an electric characteristic test shown in step S10 is conducted to complete a module shown in step 11.

As a result, the Li ion monitoring module 1 shown in FIG. 1 can be assembled.

Then, the secondary mounting step of the module shown in FIG. 15(b) is to be explained.

As shown n FIG. 1(b), external terminals 1a for solder connection are formed to the rear face of the module substrate 4 of the Li ion monitoring module 1 such that this can be mounted to a printed wiring substrate 16 as a mounting substrate at the shipping destination shown in FIG. 10.

Then, at the shipping destination of the Li ion monitoring module 1, the mounting printed wiring substrate 16 which is a PCB substrate is provided as shown in step S21 and, subsequently, solder paste is printed to the printed wiring substrate 16 as shown in step 22.

Further, after locating the Li ion monitoring module 1 on the printed wiring substrate 16 (module mounting shown in step S23) as shown in step S23, reflow is conducted as shown in step S24.

That is, as shown in FIG. 10, solder connection portions 5 are formed by solder reflow to mount the Li ion monitoring module 1 to the printed wiring substrate 16 by reflowing.

Subsequently, as shown in step S25, an electric characteristic test is conducted to complete the mounting shown in step S26.

Explanation is to be made for the characteristic portion that provides a further effect in the manufacture of the Li ion monitoring module 1 according to this invention.

At first, when a low elasticity epoxy resin of a relatively high hardness is adopted, for example, as a low elasticity resin 6, the low elasticity epoxy resin can be easily divided mechanically in the dividing step shown in step S9 of FIG. 15(a). When a silicone resin is used as the low elasticity resin 6, silicone resin residue 13b remains as a portion that can not be divided completely in the silicone resin as shown in FIG. 11.

This is a phenomenon caused by soft characteristics of the silicone resin.

Then, as a countermeasure for the silicone resin residue 13b, a cut-in portion 13a, is formed on the surface of the collective sealing portion 13 shown in FIG. 12(a) along the snap line 11c shown in FIG. 9(a) and FIG. 11 corresponding to the partition line 11b shown in FIG. 7 formed on the surface (part mounting side) of the multi-layered ceramic substrate 11, which can prevent occurrence of burrs and improve the dimensional accuracy upon division.

The cut-in portion 13a, is like a V-groove as shown in FIG. 12(b) and the cut-in portion 13a, is formed by cutting with a cut-in device having a sharp blade.

Thus, upon division of the multi-layered substrate 11, the multi-layered ceramic substrate 11 is divided along the snap line 11c and the collective sealing portion 13 is divided at the cut-in portion 13a, into individual segments.

Accordingly, the divisional operability can be improved in a case of soft resin such as silicone resin by forming the cut-in portion 13a, in the surface of the collective sealing portion 13.

Further, instead of the cut-in portion 13a, shown in FIG. 12(b), a groove 13c may be formed to the surface of the collective sealing portion 13 as shown in FIG. 12(c) by using a laser such as a YAG layer or carbon dioxide gas laser instead of the cut-in portion 13a, show in FIG. 12(b) and the divisional operability can be improved in the same manner as described above.

In this case, the depth of the groove 13c can be adjusted by controlling the intensity of the laser beam to further improve the divisional operability.

Further, when the groove 13c is formed by laser, by using a mechanism capable of accurately measuring the position for the snap line 11c in the multi-layered ceramic substrate 11 by an optical method, the groove 13c can be formed exactly along the line corresponding to the line to be divided, that is, the snap line 11c, to improve the divisional operability.

Further, when the cut-in portion 13a, shown in FIG. 12(b) or the groove 13c by the laser shown in FIG. 12(c) is formed, the multi-layered ceramic substrate 11 may not always be divided mechanically in the direction of opening the rear face thereof but it can be mechanically divided also in the direction of opening the surface of the collective sealing portion 13 on the opposite side depending on the dividing apparatus.

In this case, however, it is necessary to form the snap lines 11c shown in FIG. 11 not on the rear face but on the surface (part mounting surface) of the multi-layered ceramic substrate 11.

Further, the multi-layered ceramic substrate 11 can also be divided by dicing using a blade rotating at a high speed (cutting blade of a grinding stone) instead of mechanical division shown in FIG. 9.

In this case, the cut face can be fabricated at good dimensional accuracy.

This can decrease the clearance of the distance from the cut end to the wiring pattern in view of the design, which is effective to the miniaturizing design for the Li ion monitoring module 1.

Further, when the groove 13c is formed by using the laser, identification marks 17 such as product numbers shown in FIG. 13 to be formed on the product (Li ion monitoring module 1) can be drawn by the identical laser in each of the module regions 11a together with formation of the groove 13c (refer to FIG. 7).

That is, formation of the grooves 13c and formation of the identification marks 17 can be conducted simultaneously to make the operation efficient.

In a case where the low elasticity resin 6 is a silicone resin, the identification mark 17 applied by the laser can be formed clearly to provide an identification mark 17 favorable in view of reading.

This is because the surface of the silicone resin is a gloss surface, whereas the identification marks 17 formed by the laser is baked, engraved and blackened and, accordingly, the identification mark 17 can be made distinct by bright and dark contrast.

Further, when the multi-layered ceramic substrate 11 is mechanically divided, at first the resin coated substrate 15 is primarily divided by snap lines 11c in the longitudinal direction of the module region 11a (refer to FIG. 7) and, after the primary division, the one row segment group 11d shown in FIG. 14(b) formed by the primary division is secondarily divided along the snap line 11c parallel with the lateral direction thereof to divide the same into individual segments as shown in FIG. 14(c).

The electrodes of the module region 11a shown in FIG. 7 are arranged such that the gold wires 8 are wire bonded in the direction substantially parallel with the longitudinal direction of the rectangular module region 11a as shown in FIG. 14(b) upon wire bonding.

It may be considered that an intense force exerts on individual module regions 11a to distort the substrate itself when the rectangular multi-layered ceramic substrate 11 is divided along the lateral direction thereof relative to the longitudinal direction upon primary division (1 row division) shown in FIG. 14(a). However, when the wire bonding of the gold wires 8 are conducted in the direction of the wire loops 8a of the gold wires 8, that is, in the direction substantially parallel with the longitudinal direction of the module region 11a, the gold wires 8 are not influenced even when the distortion is caused to the substrate itself in primary division.

As a result, preferable Li ion monitoring module 1 can be assembled.

According to the semiconductor device (Li ion monitoring module 1) and the manufacturing method thereof in this embodiment, since the semiconductor chips 2, the chip parts 3 as the surface mounted parts and respective solder connection portions 5 are covered with a low elasticity resin 6 having a modulus of elasticity of 200 MPa or less at a temperature of 150° C. or higher, even when solder connection portion 5 in the inside is melted again upon mounting the Li ion monitoring module 1 by the secondary mounting reflow, the pressure by the melting expansion (solder re-melting expansion pressure 9 shown in FIG. 16) can be moderated by the low elasticity resin 6.

As a result, this can prevent peeling at the interface between the surface mounted parts and the resin (low elasticity resin 6) or at the boundary between the resin and the module substrate 4.

This can prevent flow out 10 of the solder to the boundary (refer to FIG. 16) and can prevent occurrence of short-circuit between the connection terminals 3d in the surface mounted parts.

As shown in comparative examples of FIG. 16 and FIG. 17, in the solder mounting of a chip part 18, a connection terminal 18a shown in FIG. 17 is plated with 90% SM 10% Pb solder to improve the solder wettability.

For the solder connection portion, a Pb series high temperature solder having a melting point (solidus line) of 245° C. is used, that is, a material less re-melting in the secondary mounting reflow is selected.

However, in the reflow for module assembling, plating Sn for the connection terminal is fused into the solder connection portion 18b to form a Pb—Sn eutectic phase, which lowers the melting point of the Pb series high temperature solder.

As a result, the solder connection portion 18b is in a re-molten state as shown in FIG. 16 upon secondary mounting reflow and, since a resin 20 of high hardness is used, the solder re-melting expansion pressure 9 in the solder connection portion 18b is increased to become higher than the resin pressure 19 to cause defoliation of the boundary between the resin 20 at high hardness and the chip part 18, and the solder flow out 10 is formed in flush in the gap to or result in short-circuit failure.

On the contrary, in the Li ion monitoring module 1 according to this embodiment, since flow out 10 to the solder boundary can prevented. Accordingly, the monitoring module can cope with the secondary mounting reflow.

Further, when the low elasticity resin 6 has a module of elasticity of 1 MPa or more at a temperature of 25° C., mechanical protection force (mechanical strength) can surely be maintained.

Accordingly, while preventing the flow out 10 of the solder by re-melting to the boundary, inside of the sealing portion 7 can be protected effectively.

As a result, since there is no more necessary to cover with a case or a cap, the cost can be reduced.

Further, since mechanical division after resin printing coating or mechanical division after printing can be conducted in a state of the multi-layered ceramic substrate 11 by using a silicone resin as the low elasticity resin 6, sealing or segmentation can be conducted by a method at a reduced cost.

Accordingly, the cost can be reduced in the manufacture of the Li ion monitoring module 1.

Further, since occurrence of the flow out 10 of the solder to the boundary by re-melting can be prevented, there is no more required to consider the lowering of the melting point of the inner solder caused by the combination of the electrode specification for the surface mounted parts such as the semiconductor chips 2 or the chip parts 3 solder-mounted to the Li ion monitoring module 1 and the solder applied thereto, so that either the solder plating or SN plating may be adopted for the electrode specification of the surface mounted parts.

This enables flexible coping along with the progressing situation for reducing the use of Pb in parts manufactures in view of recent Pb-free trend and, accordingly, the range corresponding to the commercial needs can be extended greatly.

The solder used for assembling the Li ion monitoring module 1 is not necessarily be a high temperature solder but 60% Sn/40Pb (eutectic solder) can be used with no problems and this can cope with a case where high temperature can not be applied to the substrate upon assembling the module by some reasons, without loosing the feature as the Li ion monitoring module 1.

Further, when a silicone resin is adopted as the low elasticity resin 6, the heat conductivity of the sealing portion 7 can be improved by controlling the filler content of the silicone resin, and the thermal resistance as one of important characteristics of the Li ion monitoring module 1 can be reduced.

Further, for the inner solder of the Li ion monitoring module 1, a solder having a low melting point in its nature, for example, Pb free-corresponding solder such as bismuth incorporated solder may also be used, not by the depression of the melting point by the melting of the part terminal plating of the solder and those having lower melting point than the temperature for the reflow mounting of the Li ion monitoring module 1 in the shipping destination can be applied with no troubles.

Further, by using the silicone resin for the low elasticity resin 6, since the silicone resin (silicone rubber) is soft, it can reduce the warp of the module substrate 4 if it is made of a ceramic substrate or a glass-incorporated epoxy substrate and, accordingly, it can reduce the potential of the troubles in the manufacturing apparatus caused due to the warp of the substrate in the module assembling step.

Further, by adopting the silicone resin for the low elasticity resin 6, the warp of the module substrate 4 can be reduced even if it is made of a ceramic substrate or glass-incorporated epoxy substrate, so that selectivity for the substrate material can be improved.

This invention has been described specifically based on the preferred embodiments of the invention made by the present inventors but the invention is not restricted to the embodiment of the invention described above but can be modified variously within a scope not departing the gist thereof.

For example, in the embodiment described above, the low elasticity resin 6 has been explained with reference to an example of a case where the low elasticity resin 6 is a silicone resin or a low elasticity epoxy resin but the low elasticity resin 6 may also be a gel-like material so long as it is within an allowable range of the modulus of elasticity explained in the preferred embodiment described above.

Further, in the preferred embodiment described above, explanation has been made to a case where the semiconductor device is an Li ion monitoring module 1. However, the semiconductor device may be other semiconductor device such as a high frequency module (high frequency power amplifier device) so long as it comprises surface mounted parts to be solder mounted and the surface mounted parts are sealed by the low elasticity resin 6.

Further, the surface mounting parts are not restricted only to the chip parts or semiconductor chips but may be other electronic parts so long as they are surface mounted parts to be mounted by soldering.

Further, the semiconductor device described above may also be of such a structure that semiconductor chips and a wiring substrate are opposed, and the surface electrodes of the semiconductor chips and the substrate terminals formed at the surface with a gold plating layer, Sn plating layer or Pb—Sn series solder plating layer are bump connected by way of gold bumps or solder bumps.

The effects obtained by typical inventions among those disclosed in the present application are simply explained as below.

(1) Since the surface mounted parts to be solder mounted and the solder connection portions thereof are covered with a low elasticity resin having a modulus elasticity of 200 MPa or less at a temperatures of 150° C. or higher when the semiconductor device is mounted by reflow in secondary mounting, even if the internal solder connection portion is re-melted, the pressure caused by the melting expansion can be moderated by the low elasticity resin. As a result, flow out of the solder to the boundary between the surface mounted parts and the resin to prevent the occurrence of short-circuit between the terminals in the surface mounted parts.

(2) Since the flow out of the solder to the boundary can be prevented, it can cope with the secondary mounting by reflow and when the low elasticity resin has a modulus of elasticity of 1 MPa or more at a temperature of 25° C., a sufficient mechanical protection force can be ensured. Accordingly, since it is no more necessary to cover with a casing or a cap, the cost can be reduced.

(3) Since the resin printing coating or the mechanical division after printing can be conducted in a state of a substrate to prepare multiple segments by the use of the silicone resin as the low elasticity resin, sealing or segmentation can be conducted by a method at a reduced cost and, accordingly, the cost can be reduced in the manufacture of the semiconductor device.

(4) Since the flow out of the solder by re-melting to the boundary can be prevented, there is no more necessary to consider the lowering of the melting point of the internal solder caused by the combination of the electrode specification of the surface mounted parts and the solder to be applied, either the solder plating or Sn plating may be adopted to the electrode specification for the surface mounted parts. This enables flexible coping in accordance with the progressing situation for the Pb free trend in parts manufacturers.

What is claimed is:

1. A semiconductor device comprising:
   surface mounted parts;
   a first substrate on which the surface mounted parts are mounted by soldering;
   solder connection portions for connecting the surface mounted parts to the wiring substrate; and
   a sealing portion formed with an elastic insulative resin for covering the surface mounted parts and the solder connection portions,
   wherein the elastic resin is a resin having a modulus of elasticity of 1 MPa to 200 MPa at a temperature of 150° C. or higher.

2. A semiconductor device according to claim 1, wherein the elastic resin is a resin having a modulus of elasticity of 1 MPa to 200 MPa at a temperature of 25° C.

3. A semiconductor device according to claim 1, wherein the elastic resin is a silicone resin.

4. A semiconductor device according to claim 1, wherein the elastic resin is an epoxy resin.

5. A semiconductor device according to claim 1, wherein the surface mounted parts are mounted by first soldering and the semiconductor device is mounted on a second substrate by second soldering.

6. A semiconductor device comprising:
   surface mounted parts;
   a wiring substrate on which the surface mounted parts are mounted by soldering;
   solder connection portions for connecting the surface mounted parts to the wiring substrate; and
   a sealing portion formed with a silicone resin which is an elastic insulative resin for covering the surface mounted parts and the solder connection portions,
   wherein the silicone resin has a modulus of elasticity of 1 to 200 MPa at a temperature of 150° C. or higher.

7. A semiconductor device according to claim 6, wherein the surface mounted parts are mounted by first soldering and the semiconductor device is mounted on a second substrate by second soldering.

8. A semiconductor device comprising:
   semiconductor chips which are surface mounted parts each formed with a surface electrode at its main surface;
   chip parts which are surface mounted parts each formed with connection terminals on both ends;
   a module substrate which is a wiring substrate on which the semiconductor chips and the chip parts are mounted by soldering;
   solder connection portions for connecting the chip parts to the wiring substrate; and
   a sealing portion formed with a silicone resin which is an elastic insulative resin for covering the semiconductor chips, the chip parts and the solder connection portions,
   wherein the silicone resin has a modulus of elasticity of 1 to 200 MPa at a temperature of 150° C. or higher.

9. A semiconductor device according to claim 8, wherein the semiconductor chips and the chip parts are mounted by first soldering and the semiconductor device is mounted on a second substrate by second soldering.

10. A semiconductor device comprising:
    semiconductor chips which are surface mounted parts formed with a surface electrode at the main surface;
    chip parts which are surface mounted parts each formed with connection terminals on both ends;
    a module substrate which is a wiring substrate on which the semiconductor chips and the chip parts are mounted by soldering;
    solder connection portions for connecting the chip parts to the wiring substrate; and
    a sealing portion formed with an insulative resin having a modulus of elasticity of 1 MPa to 200 MPa at a temperature of 150° C. or more and a modulus of elasticity of 200 MPa or more at a temperature of 25° C. for covering the semiconductor chips, the chip parts and the solder connection portions.

11. A semiconductor device according to claim 10, wherein the insulative resin is an epoxy resin.

12. A semiconductor device according to claim 11, wherein the chip parts are mounted by the first soldering to the substrate terminals each formed with a gold plating layer, Sn plating layer or Pb—Sn series solder plating layer at the surface.

13. A semiconductor device according to claim 1, wherein the surface electrodes of the semiconductor chips are wire bonded by gold wires to the substrate terminals each formed with a gold plating layer, with a Sn plating layer or a Pb—Sn series solder plating layer at the surface.

14. A semiconductor device according to claim 13, wherein the semiconductor chips and the chip parts are mounted on a rectangular module substrate as said module substrate, and the wire loops of the gold wires are formed in a direction parallel with a longitudinal direction of the module substrate.

15. A semiconductor device according to claim 12, wherein the main surface of the semiconductor chips and the surface of the wiring substrate on the side of supporting the chips are opposed to each other and the surface electrodes of the semiconductor chip and the substrate terminals each formed with a gold metal layer, an Sn plating layer or a Pb—Sn series Bolder plating layer at the surface are connected by way of gold bumps or solder bumps.

16. A semiconductor device according to claim 10, wherein the semiconductor chips and the chip parts are mounted by first soldering and the semiconductor device is mounted on a second substrate by second soldering.

* * * * *